United States Patent
Furuyama

(10) Patent No.: US 10,686,093 B2
(45) Date of Patent: Jun. 16, 2020

(54) SEMICONDUCTOR LIGHT RECEIVING ELEMENT INCLUDING SI AVALANCHE MULTIPLICATION PART AND COMPOUND SEMICONDUCTOR LIGHT RECEIVING LAYER

(71) Applicant: Kabushiki Kaisha Toshiba, Tokyo (JP)

(72) Inventor: Hideto Furuyama, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 16/126,659

(22) Filed: Sep. 10, 2018

(65) Prior Publication Data

US 2019/0259900 A1    Aug. 22, 2019

(30) Foreign Application Priority Data

Feb. 20, 2018  (JP) .................................. 2018-027879

(51) Int. Cl.
*H01L 31/107* (2006.01)
*H01L 31/18* (2006.01)
(Continued)

(52) U.S. Cl.
CPC ........ *H01L 31/1075* (2013.01); *H01L 31/028* (2013.01); *H01L 31/022408* (2013.01); *H01L 31/1804* (2013.01); *H01L 31/1868* (2013.01)

(58) Field of Classification Search
CPC ......... H01L 31/1075; H01L 31/022408; H01L 31/1804; H01L 31/1868
See application file for complete search history.

(56) References Cited

U.S. PATENT DOCUMENTS 6,157,047 A * 12/2000 Fujita ..................... H01L 33/34
257/51
6,518,638 B1 * 2/2003 Kuhara .............. G02B 6/12004
257/431
(Continued)

FOREIGN PATENT DOCUMENTS

JP   2006-344831 A   12/2006
JP   2016-92078 A   5/2016
JP   6024755 B2   11/2016

OTHER PUBLICATIONS

A. Hawkins et al.; "High Gain-Bandwidth-Production Silicon Heterointerface Photodetector", Applied Physics Letters, vol. 70, No. 3, pp. 303-305 (1997).

*Primary Examiner* — Phuc T Dang
(74) *Attorney, Agent, or Firm* — Finnegan, Henderson, Farabow, Garrett & Dunner, L.L.P.

(57) ABSTRACT

According to one embodiment, a semiconductor light receiving element is disclosed. The semiconductor light receiving element includes a Si substrate, a Si pn junction, a passivation film, and a compound semiconductor light receiving layer. The Si avalanche multiplication part is provided on the Si substrate. The Si pn junction surrounds the Si avalanche multiplication part, and includes a junction end part at a height different from that of the Si avalanche multiplication part. The passivation film is provided on the junction end part of the Si pn junction. The compound semiconductor light receiving layer is selectively provided inside a region on the Si pn junction.

17 Claims, 10 Drawing Sheets

(51) Int. Cl.
*H01L 31/028* (2006.01)
*H01L 31/0224* (2006.01)

(56) References Cited

U.S. PATENT DOCUMENTS

| | | | |
|---|---|---|---|
| 9,553,224 B2 | 1/2017 | Kawaguchi et al. | |
| 2003/0092226 A1* | 5/2003 | Nagashima | H01L 31/02167 438/184 |
| 2011/0180894 A1* | 7/2011 | Samuelson | H01L 31/03529 257/438 |
| 2011/0193940 A1* | 8/2011 | Park | H01L 27/14629 348/46 |
| 2011/0298076 A1* | 12/2011 | Yamamura | H01L 27/1446 257/432 |
| 2013/0082286 A1 | 4/2013 | Finkelstein et al. | |
| 2016/0126218 A1 | 5/2016 | Kurita | |
| 2016/0211402 A1 | 7/2016 | Joo et al. | |

* cited by examiner

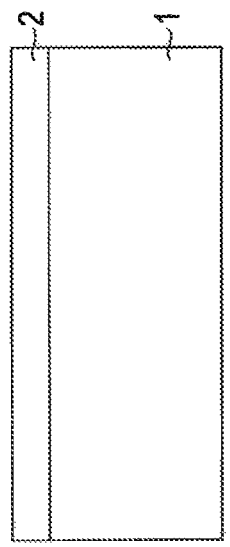
F I G. 2A
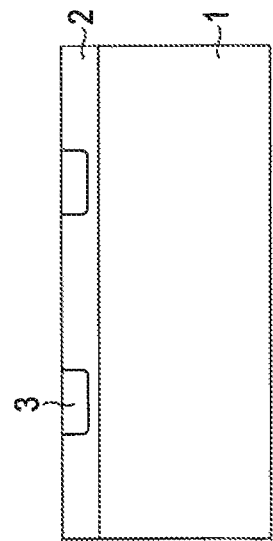
F I G. 2B
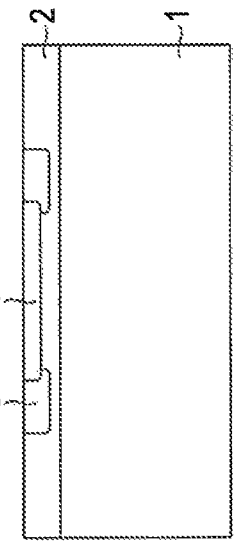
F I G. 2C
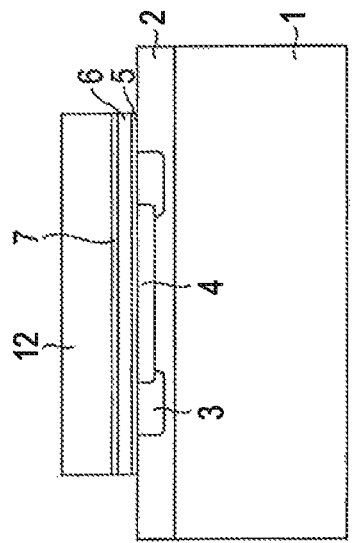
F I G. 2D
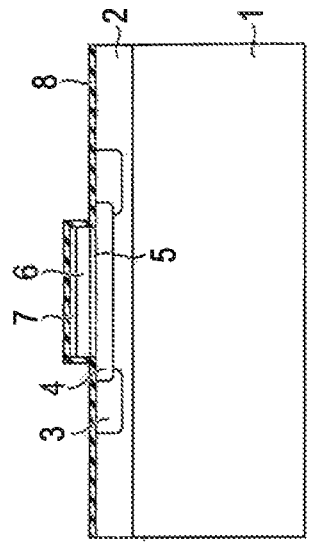
F I G. 2E
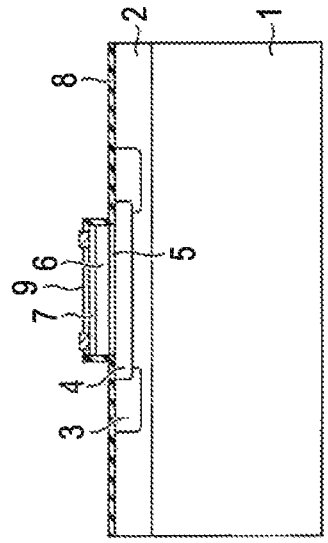
F I G. 2F

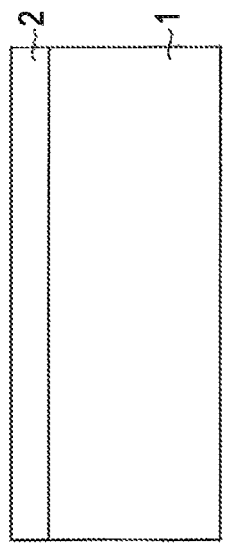
FIG. 12A
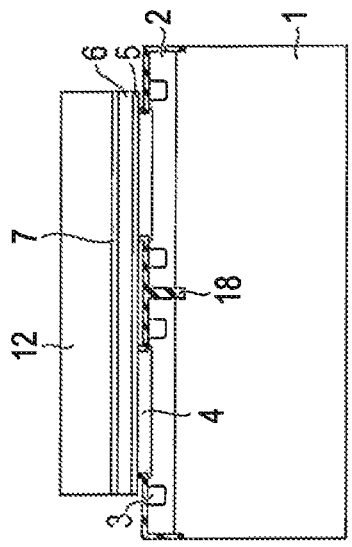
FIG. 12B
FIG. 12C
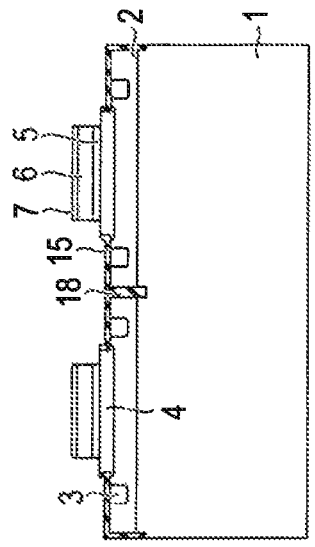
FIG. 12D
FIG. 12E
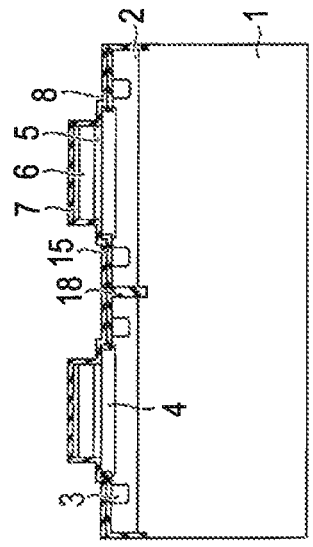
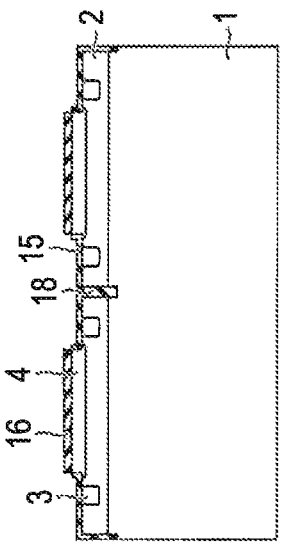
FIG. 12F

SEMICONDUCTOR LIGHT RECEIVING ELEMENT INCLUDING SI AVALANCHE MULTIPLICATION PART AND COMPOUND SEMICONDUCTOR LIGHT RECEIVING LAYER

CROSS-REFERENCE TO RELATED APPLICATIONS

This application is based upon and claims the benefit of priority from Japanese Patent Application No. 2018-027879, filed Feb. 20, 2018, the entire contents of which are incorporated herein by reference.

FIELD

Embodiments described herein relate generally to a semiconductor light receiving element and manufacturing method thereof.

BACKGROUND

Semiconductor light receiving elements are used in the technical field such as an optical fiber communication or an optical remote sensing. As a material of the light receiving elements, Si, Ge, GaAs, GaInAs/InP or the like is appropriately used depending on receiving light wavelengths.

BRIEF DESCRIPTION OF THE DRAWINGS

FIGS. 2A, 2B, 2C, 2D, 2E and 2F are schematic cross-sectional views of manufacturing processes of the semiconductor light receiving element according to the first embodiment.

FIGS. 12A, 12B, 12C, 12D, 12E and 12F are schematic cross-sectional views of manufacturing processes of the semiconductor light receiving element according to the seventh embodiment.

DETAILED DESCRIPTION

Figure 1A:
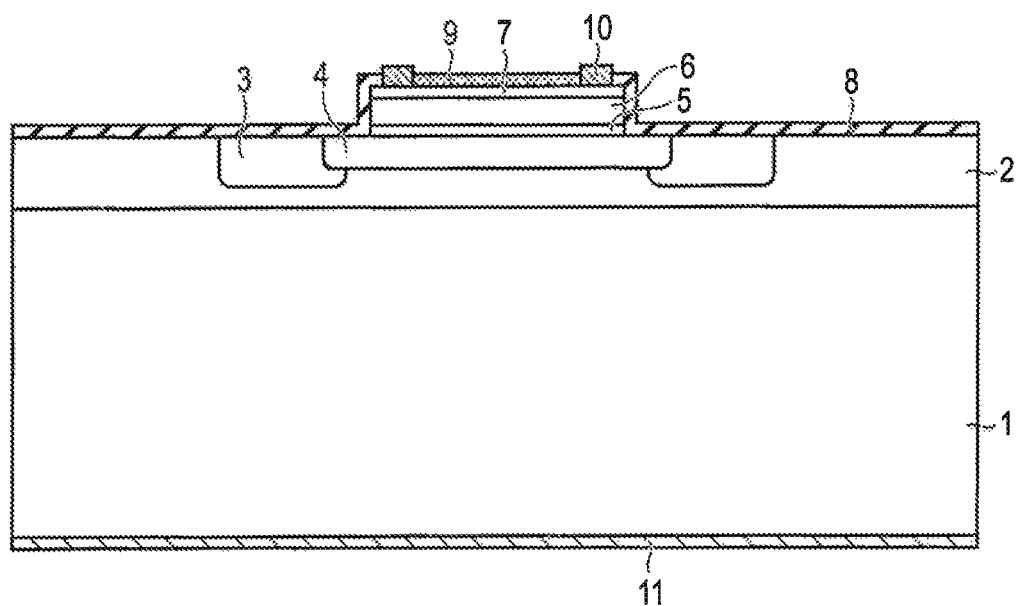
FIG. 1A is a schematic cross-sectional view of a semiconductor light receiving element according to a first embodiment.

In general, according to one embodiment, a semiconductor light receiving element includes a Si substrate, a Si pn junction, a passivation film, and a compound semiconductor light receiving layer. The Si avalanche multiplication part is provided on the Si substrate. The Si pn junction surrounds the Si avalanche multiplication part, and includes a junction end part at a height different from that of the Si avalanche multiplication part. The passivation film is provided on the junction end part of the Si pn junction. The compound semiconductor light receiving layer is selectively provided inside a region on the Si pn junction.

Embodiments will be described hereinafter with reference to the accompanying drawings. The drawings are schematic or conceptual drawings, and dimensions and ratios are not necessarily the same as those in reality. In addition, as used in the description and the appended claims, what is expressed by a singular form shall include the meaning of "more than one".

For the purpose of automated driving of automobiles, autonomous running of robots or the like, various types of ranging sensors have been developed, above optical ranging sensors are competitive in distance resolution, two or three dimensional imaging, or the like. An optical ranging finding sensor, which is for comparative long-distance about 100 m, employs a laser as a light source and an avalanche photodiode (light receiving element) that operates in Geiger mode, and measures the reflection delay of light in order to sense the distance. Until now, visible light to far-red light has been generally used for those optical ranging finding sensors, and particularly, light with around 900 to 950 nm wavelength, hereinafter referred to as 900 nm band, is frequently used for which a relatively low cost Si light receiving element can be used in the wavelength window that weakens background light of the sun. In addition, the light of 900 nm band is so-called eye-safe light that has an arrival rate at the retina of the eye lower than that of the visible light, and thus the light of 900 nm band is relatively safe even though it is used for sensing of humans.

However, the reason for the weakness of background light of 900 nm band is water vapor absorption in the atmosphere, and the water vapor absorption causes a problem of lowering transmittance of the light, and thus the measurable distance of the ranging optical sensor is restricted by the water vapor absorption in the atmosphere and affected by weather or the like.

In contrast, in case of a relatively long wavelength in which light absorption caused by the water vapor is small (e.g., 1500 to 1750 nm wavelength), although the background light intensity of the sun is weak and approximately the same as that in the 900 nm band, the light absorption by the atmosphere is small and allowable light exposure amount to the eye is also increases significantly. Consequently, the relatively long wavelength is advantageous for the light sensing. For example, in the light of 1500 to 1750 nm wavelength, background light intensity except for a narrow water vapor absorption peak is almost equal to that in the 900 nm band, and light transmittance in the 900 nm band is about 50%, whereas light transmittance in the wavelength of 1550, 1560, 1590, 1620, 1630 nm are almost 100%. In addition, light transmittance to the retina of the eye is lower than that in the 900 nm band by one digit or more. That is, when the light sensing is performed in 1500 to 1750 nm wavelength, hereinafter referred to as 1600 nm band, a light source intensity can be set higher by one digit and the light transmittance is also high, so that the S/N ratio in the light sensing is greatly improved. Consequently, the light sensing in the 1600 nm band is advantageous for a high resolution optical ranging measurement, a long distance optical ranging measurement, and the like. In addition, since there is almost no light absorption by moisture, light is scattered by water droplets and snow, but there is also an advantage that an influence by the weather is alleviated by the fact that there is no substantial light absorption.

However, the low cost Si photodetector (light receiving element) has very few sensitivity in the 1600 nm band, and thus a GaInAs/InP photodetector, or a Ge photodetector is required, which is used in long-haul optical fiber communication in 1550 nm wavelength or the like. The Ge photodetector forms a pn junction in a monocrystalline Ge having a narrow band gap, and thus a dark current caused by inter-band tunneling is easily generated. In addition, it is difficult to form a firm passivation on the pn junction edge of the Ge photodetector. Consequently, the Ge photodetector has difficulty in achieving low cost and low noise compared to the Si photodetector. On the other hand, the GaInAs/InP (composite semiconductor) photodetector has difficulty in enlarging a diameter of wafer since stability of the crystalline growth of the composite semiconductor is low compared to a crystalline growth of a monocrystalline semiconductor such as Si or Ge. In addition, as the GaInAs/InP photodetectors are manufactured in a small-diameter wafer formed of a rare material, it is difficult to reduce material cost and process cost per element.

In general, Si devices such as LSIs, the process cost per element can be reduced since a mass production is performed by batch process using a large-diameter Si wafer. However, the large-diameter wafer requires large capital investment, it is required to optimize the diameter of wafer according to the number of devices in demand. In general, the semiconductor device in high demand has advantage in reducing cost by the manufacturing using the large-diameter wafer. Consequently, the devices using the compound semiconductor which has difficulty in enlarging the diameter of wafer, have a problem in reducing the cost as compared with Si devices regardless of the number of demanded devices. For this reason, a novel proposal for a semiconductor light receiving element of low noise and a low cost in the 1600 nm band is required, and embodiments can cope with such a problem.

First Embodiment

Figure 1B:
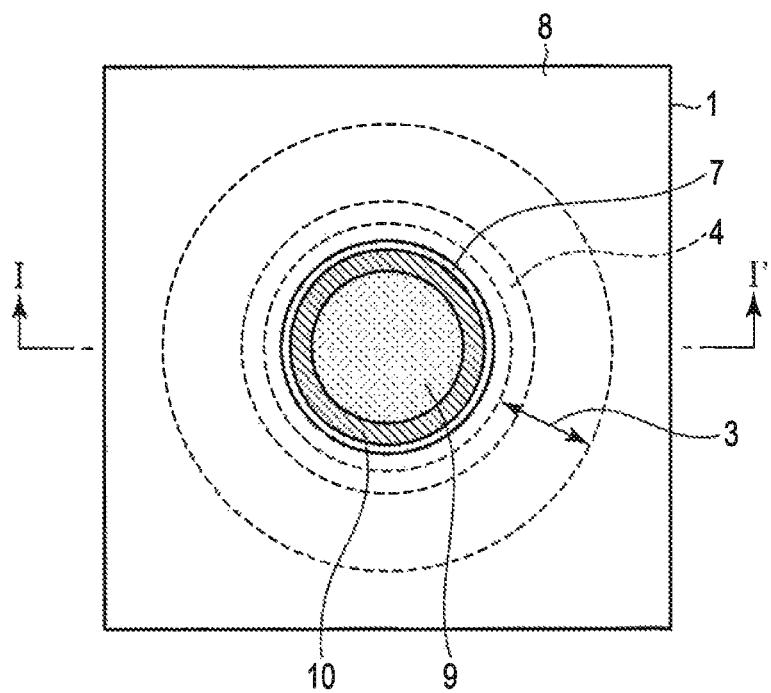
FIG. 1B is a schematic top view of the semiconductor light receiving element according to the first embodiment.

FIGS. 1A and 1B are schematic views illustrating a first embodiment, more particularly, FIG. 1A is a schematic cross-sectional view, and FIG. 1B is a schematic top view. FIG. 1A corresponds a cross-section along the line I-I' in FIG. 1B. In FIGS. 1A and 1B, 1 denotes an n-Si substrate (e.g., n=5×10$^{18}$ cm$^{-3}$), 2 denotes an n-Si epilayer (e.g., n=5×10$^{16}$ cm$^{-3}$, thickness=5 µm), 3 denotes a p-Si guard ring (e.g., B ion implantation, p=2×10$^{17}$ cm$^{-3}$, depth=3 µm), 4 denotes a p-Si (e.g., B ion implantation, p=1×10$^{19}$ cm$^{-3}$, depth=0.2 µm), 5 denotes a low concentration p-type or non-doped InP (e.g., residual carrier concentrations=2>10$^{14}$ cm$^{-3}$, thickness=0.05 µm), 6 denotes an undoped Ga$_{0.47}$In$_{0.53}$As (e.g., residual carrier concentrations=3×10$^{14}$ cm$^{-3}$, thickness=1 µm, hereinafter, referred as a GaInAs), 7 denotes a p-type InP (e.g., p=1×10$^{19}$ cm$^{-3}$, thickness=0.5 µm), 8 denotes a SiO$_2$ passivation film (e.g., thickness=0.3 µm), 9 denotes an anti-reflection (AR) coat (e.g., silicon nitride film (SiN) having a refraction index of 2.0, thickness=0.2 µm), 10 denotes a p electrode (e.g., Ti/Pt/Au), and 11 denotes an n electrode (e.g., Al). A circumferential portion of the p-Si 4 overlaps a part of the guard ring of the p-Si 3 to suppress a local breakdown at the outer circumference of the p-Si 4. Alternatively, the p-Si 4 and the guard ring of the p-Si 3 do not need be in contact with each other from the beginning, but the p-Si 4 and the guard ring of the p-Si 3 may be separated from each other as long as a depletion layer which extends from the p-Si 4 and reaches the p-Si 3 before the local breakdown at the outer circumference region of the p-Si 4 occurs. This will be illustrated in the embodiment to be hereinafter described.

Here, the InP 5, the GaInAs 6, the p-InP 7 are formed on a region of the p-Si (the p-Si 3 and the p-Si 4), ideally only on the p-Si 3. In this case, at least the InP 5 may be formed on the region the p-Si 4, and the GaInAs 6 and the p-InP 7 may be protrude from the region of the p-Si 4 at an upper part. The outer circumference of the p-Si 3 is preferably apart from the outer edge of the InP 5 at least a carrier diffusion length of electrons (or holes). This provides advantage to suppress the local breakdown which is caused since the received carriers of the compound semiconductor layer reach the outer circumference of the p-Si 3. In addition, likewise, when the guard ring of the p-Si 3 and the p-Si 4 described above are separated from each other, it is preferable that the outer circumference of the p-Si 4 is apart from the circumference of the InP 5 by at least the diffusion length of electrons (or the holes).

In addition, as described below, the residual carrier concentrations of the InP 5 and the GaInAs 6 are set to be sufficiently low, such that an internal potential due to an electron affinity difference between the p-Si 4 and the InP 5 (hetero-barrier, 0.4 to 0.5 eV) depletes the GaInAs 6 in order to match Fermi levels of the p-Si 4 and the p-InP 7 in a thermal equilibrium state to each other.

When a reverse bias voltage (the electrode 10 is a negative electrode and the electrode 11 is a positive electrode) is applied to this device, an electric field strength is increased in a pn junction portion between the p-Si 4 and the n-Si 2 (one-sided abrupt junction), and impurity concentrations of the p-Si 4 is high, so that a depletion layer extends in a region of the n-Si 2. When the reverse bias voltage is further raised, a high electric field region of the n-Si epitaxial layer 2 in contact with the n-Si 4 starts to be avalanche-multiplied, and when the reverse bias voltage reaches avalanche breakdown voltage ($V_B$), the device current using dark current as a seed rapidly increases, and thus the device voltage can not be increased. When the above mentioned impurity concentrations and thickness is employed, the $V_B$ is around 20 V. In Si, an ionization rate of electrons is 10 to 50 times the ionization rate of holes, and thus the avalanche multiplication is mainly based on electron multiplication.

In general, as a ratio of the ionization rate of the electrons and holes is increased, the excessive noise of the avalanche multiplication becomes is decreased, and Si has the largest ratio between ionization rates among general semiconductor materials (avalanche excessive noise is small). In the semiconductor light receiving element of the present embodiment, an avalanche multiplication part is formed of Si, so that very low-noise avalanche multiplication is possible.

When a reverse bias voltage equal to or less than $V_B$ is applied to the semiconductor light receiving element and light having a wavelength of, for example, 1600 nm is irradiated from an upper surface of the semiconductor light receiving element in a state where the avalanche multiplication is possible, the light is absorbed by the GaInAs layer 6, and thus electron-hole pairs are generated. As described above, the GaInAs 6 is depleted by the internal potential difference of the hetero-interface, and electrons drift and move toward the p-Si 4 and holes drift and move toward the p-InP 7. The holes are absorbed by the negative electrode to disappear, but the electrons are accumulated on an interface between the GaInAs 6 and the InP 5 and an interface between the InP 5 and the p-Si 4, and the electrons of high energy side of a thermal equilibrium distribution are injected into the p-Si 4. The electrons injected into the p-Si 4 reach the n-Si 2 by concentration difference diffusion, and are electron-multiplied by the n-Si 2 in a state capable of avalanche multiplication, and the electron-multiplied electrons become a main current of the device. In the semiconductor light receiving element, it is possible to receive light at a wavelength of 950 to 1700 nm, and it is possible to receive light in the 900 nm band that has been mainly used conventionally as well as light having a wavelength of 1000 nm or more that is difficult to receive by the Si light receiving device.

In addition, when large resistance (e.g., 200 kΩ) is connected as an external resistance between the electrode (e.g., the electrode 10) of the device and a power supply, and a voltage applied to the semiconductor light receiving element is set to $V_B$ or more (e.g., $V_B$+5 V), the current by the dark-current multiplication of the device and a voltage drop by the external resistance are generated, and thus the device current becomes about 25 µA and a device voltage becomes close to $V_B$. In this state, when the light having the wavelength of, for example, 1600 nm is irradiated, even with relatively weak light, a large current of several hundred to several thousand times due to the avalanche multiplication flows, and the avalanche multiplication is immediately suppressed by the voltage drop by the external resistance. When this current is observed, this current is a current having a pulse shape, and the semiconductor light receiving element is operated in a so-called Geiger mode in which a pulse is generated by a slight light input. The current (carrier charge) generated during this time is accumulated in a device capacitance (a pn junction capacitance, or the like) between the electrode 10 and the electrode 11, and is gradually recovered to an original bias state by discharging depending on the CR product with the external resistance.

The one-sided abrupt pn junction (avalanche multiplication part) between the p-Si 4 and the n-Si 2 in which a high electric field for the avalanche multiplication is generated is surrounded by the guard ring of the p-Si 3, and thus edge local breakdown of the one-sided abrupt pn junction is prevented. In the pn junction between the guard ring (p-Si 3) and the n-Si 2, the p-Si 3 has a relatively low concentration, so that the depletion layer also extends on the p-Si 3 side, an electric field peak strength becomes relatively low, and a curvature of a protrusion portion of a lower portion of an outer side of the guard ring is equivalently made gentle to suppress local electric field concentration. In addition, since the pn junction between the p-Si 3 and the n-Si 2 exposes a junction end to a surface of the n-Si 2 and constitutes a low electric field pn junction between Si and Si at a position separated from the avalanche multiplication part to which the high electric field is applied, and thus enabling very low dark current by strongly protecting the exposed pn junction using a passivation film such as $SiO_2$.

As a result, at a light reception wavelength determined by the compound semiconductor, it is possible to realize equivalent high sensitivity light reception using low noise multiplication by Si avalanche, and it is possible to realize any low cost wavelength light receiving element having a high performance together with a reduction in a cost by a pseudo large diameter compound semiconductor wafer to be described below.

Noted that, in the Si avalanche photodiode (hereafter, referred as a Si-APD) of 900 nm band, Si which functions as a light absorbing layer has low a light absorption coefficient, and thus a thick Si light absorbing layer (depletion region) is required. For example, a Si thickness for obtaining a quantum efficiency of 80% is about 25 µm at 850 nm, but needs to be about 80 µm at 950 nm. For this reason, in addition to a voltage required for the avalanche multiplication, a high voltage such as 50 V to 150 V is required. In addition, since light can also be absorbed by Si other than the avalanche multiplication part (for example, the n-Si 2 outside the guard ring 3), electron-hole pairs are generated by absorbing the light in a Si region that is not depleted when a bias voltage is applied, and carriers reaching the depletion region by diffusion (so-called a diffusion current) generate a delay current or a crosstalk in an array light receiving device. Further, when the light is irradiated to a guard ring portion, a depletion layer of the guard ring may be contracted and deformed by a light absorbing carrier to cause local breakdown or a current channel may be formed in a pn junction end passivation to cause surge dielectric breakdown.

In the semiconductor light receiving element of the present embodiment, an absorption coefficient of the GaInAs is sufficiently high in the 1600 nm band, and a quantum efficiency of 80% can thus be obtained at a thickness of about 3 µm. A quantum efficiency of 40% is possible even at the thickness of 1 µm described above, and this thickness is sufficient when photons are counted using the avalanche multiplication. In addition, the bias voltage is also automatically biased as an internal potential of a hetero-interface in the light receiving layer, and an avalanche voltage is also about 20 V, and thus an operating voltage is low. Further, depletion layer regions such as the avalanche multiplication part and the vicinity of the guard ring or other non-depletion regions do not almost absorb the light at 1600 nm, and there is no risk such as local breakdown or dielectric breakdown of the passivation due to light irradiation. Even though the semiconductor light receiving element of the present embodiment is used at 950 nm, a light receiving efficiency is the same, and the light is absorbed in the depletion layer region such as the avalanche multiplication part and the vicinity of the guard ring or other non-depletion regions, but since the number of light receiving carriers of the compound semiconductor is very large and an operation is possible in a state where the bias voltage is low, there is substantially no risk of the local breakdown or the dielectric breakdown of the passivation due to the light irradiation.

In addition, JP 2006-344831 A, Applied Physics Letters Vol. 70, p. 303 (1997), and the like, disclose semiconductor light receiving elements including a GaInAs or Ge light receiving layer and a Si avalanche multiplication layer similar to the present embodiment. However, since these semiconductor light receiving elements are mesa type devices, carriers generated in the light receiving layer are injected into the avalanche multiplication part and at the same time, reach a Si-pn junction end (passivation part), resulting in instability of passivation and surge destruction.

In the semiconductor light receiving element of the present embodiment, since a light receiving portion by a compound semiconductor such as GaInAs is formed only on a p-Si region and is formed on a region (ideally, only on an avalanche multiplication part) sufficiently is separated from the pn junction portion around the guard ring 3, the semiconductor light receiving element can be designed so that the light receiving carriers hardly reach a pn junction end passivation portion, and reliability and characteristic stability of the semiconductor light receiving element can be improved.

FIGS. 2A to 2F are schematic cross-sectional views showing manufacturing processes of the semiconductor light receiving element of the first embodiment, and the same portions as those of FIGS. 1A and 1B are denoted by the same reference numerals.

FIG. 2A shows a formation of the n-Si 2 onto the n-Si substrate 1, for example, n-type Si crystal is epitaxially grown by chemical vapor deposition (CVD) process in which $SiHCl_3$ is used as a source, and P, As, Sb or the like is used as a dopant.

FIG. 2B shows a formation of the guard ring p-Si 3 by using, for example, boron (B) ion implantation and thermal annealing, and the ion implantation includes implanting ions from a shallow region to a deep region by multi-implantation to form a uniform dopant profile.

FIG. 2C shows a formation of the high concentrations p-Si 4, which is performed by using, for example, a shallow high concentrations B ion implantation and a rapid thermal annealing (RTA), in a manner that a sharp concentration gradient is formed.

FIG. 2D shows adhering of compound semiconductor chips obtained by dividing a epitaxially grown compound semiconductor wafer, in which the InP 5 is brought into contact with the p-Si 4 in a clean state, and then heat treatment is performed with applying pressure to adhere the InP and the Si to each other. And epitaxial crystal growth of the p-InP 7, the GaInAs 6 and the InP 5 are performed in this order by metal organic chemical vapor deposition (MO-CVD) or the like. At this time, epitaxial crystal growth of an etching stopper layer such as a buffer InP, GaInAs or the like onto the InP substrate may be performed beforehand, and in this case, the InP substrate is easily removed by selective etching in the later stage. In addition, thin GaInAsP (for example, $Ga_{0.28}In_{0.72}As_{0.61}P_{0.39}$, thickness=0.01 μm) may be grown between the p-InP 7 and the GaPnAs 6 and between the GaInAs 6 and the InP 5, respectively. In this case, there is an effect of alleviating carrier stay in a hetero gap when carriers generated by absorbing light by GaInAs move beyond a hetero-interface.

In a step of FIG. 2D, the compound semiconductor chip may have an area somewhat larger than the region of the p-Si 4 (e.g., sum of the area of the p-Si 4 and the area of an alignment margin). In addition, the adhering of the compound semiconductor chip may be performed by a method disclosed in JP 2016-92078 A, or the like. In this case, a large diameter wafer (for example, 8 inch Φ, 12 inch Φ, or the like) can be used as a Si wafer, and thus a size of the Si wafer can be set independently of a size of a epitaxially grown compound semiconductor wafer. The adhering of compound semiconductor chips may be performed in a unit of a light receiving region size of a semiconductor light receiving element, or a size covering an array region in the case of a semiconductor light receiving element array or the like, and sizes of the Si wafer and the epitaxially grown compound semiconductor wafer can be set completely independently of each other by adhering compound semiconductor chips obtained from several epitaxially grown compound semiconductor wafers to one Si wafer. In this way, a pseudo large diameter compound semiconductor wafer can be configured by using an epitaxially grown compound semiconductor wafer having a small diameter, and a manufacturing process cost per device can be reduced by performing the subsequent processes in a unit of a large diameter Si wafer.

FIG. 2E shows a trimming of the compound semiconductor layer and a formation of the passivation film 8. The InP substrate 12 is removed by mechanical grinding and etching, and the compound semiconductor is etched and removed in a state where the light receiving region remains by photolithography. At this time, if the above mentioned epitaxial crystal growth of the etching stopper layer such as GaInAs has been performed on the InP substrate, the InP substrate can be selectively removed by etching using hydrochloric acid solution. The etching stopper layer such as GaInAs can be selectively removed by a sulfuric acid based etching solution (for example, mixed solution of sulfuric acid, hydrogen peroxide, and water). The formation of the light receiving region by photolithography can be performed by combination of the similar selective etching, or dry etching. Note that, even the compound semiconductor chip is slightly misaligned in the stage of FIG. 2D, the light receiving area and the p-Si 4 can be accurately aligned in stage of FIG. 2S since a mask pattern of the photolithography can determine the final light receiving area.

After that, the passivation film 8 is formed. For example, $SiO_2$ is formed by plasma CVD, and heat treatment at, for example, 600° C. is performed. Since Si and InP have thermal expansion coefficients that are different from each other nearly twice as much, in wafer level bonding or bonding between chips having a size of several millimeters, wafer warpage or crack occurs due to thermal stress by such a high temperature treatment. However, when the compound semiconductor layer is trimmed at a light element size (for example, a diameter of 100 μm) as shown in FIG. 2E, an absolute value of the thermal stress is small, so that the heat treatment can be performed without causing the problems. For this reason, the $SiO_2$ film by the CVD can become a relatively good passivation film. In addition, $SiO_2$ is to be a good passivation film for Si, whereas nitride Si (SiN) is generally a good passivation film for compound semiconductor such as InP. For this reason, in the step of FIG. 2E, the heat treatment may be performed in a state where the $SiO_2$ film is provided on the pn junction (the n-Si 2 and the p-Si 3) of Si, and the SiN film is provided on side surfaces of the compound semiconductor of 5 to 7. In this case, the SiN passivation film can also serve as an AR film 9 to be described below.

FIG. 2F shows a formation of the AR film 9 by photolithography and CVD, and formations of the electrodes 10 and 11. An electrode metal can be formed by, for example, sputtering, electron beam evaporation, or the like.

As described above, in the semiconductor light receiving element of the present embodiment, it is possible to reduce the process cost by configuring the pseudo large-diameter compound semiconductor wafer and collectively processing a number of the elements without using the large diameter compound semiconductor wafer. In this way, it is possible to solve the problem that the cost cannot be reduced regardless of the number of demanded elements in the compound semiconductor in which it is difficult to increase the diameter of the wafer.

Figure 3:
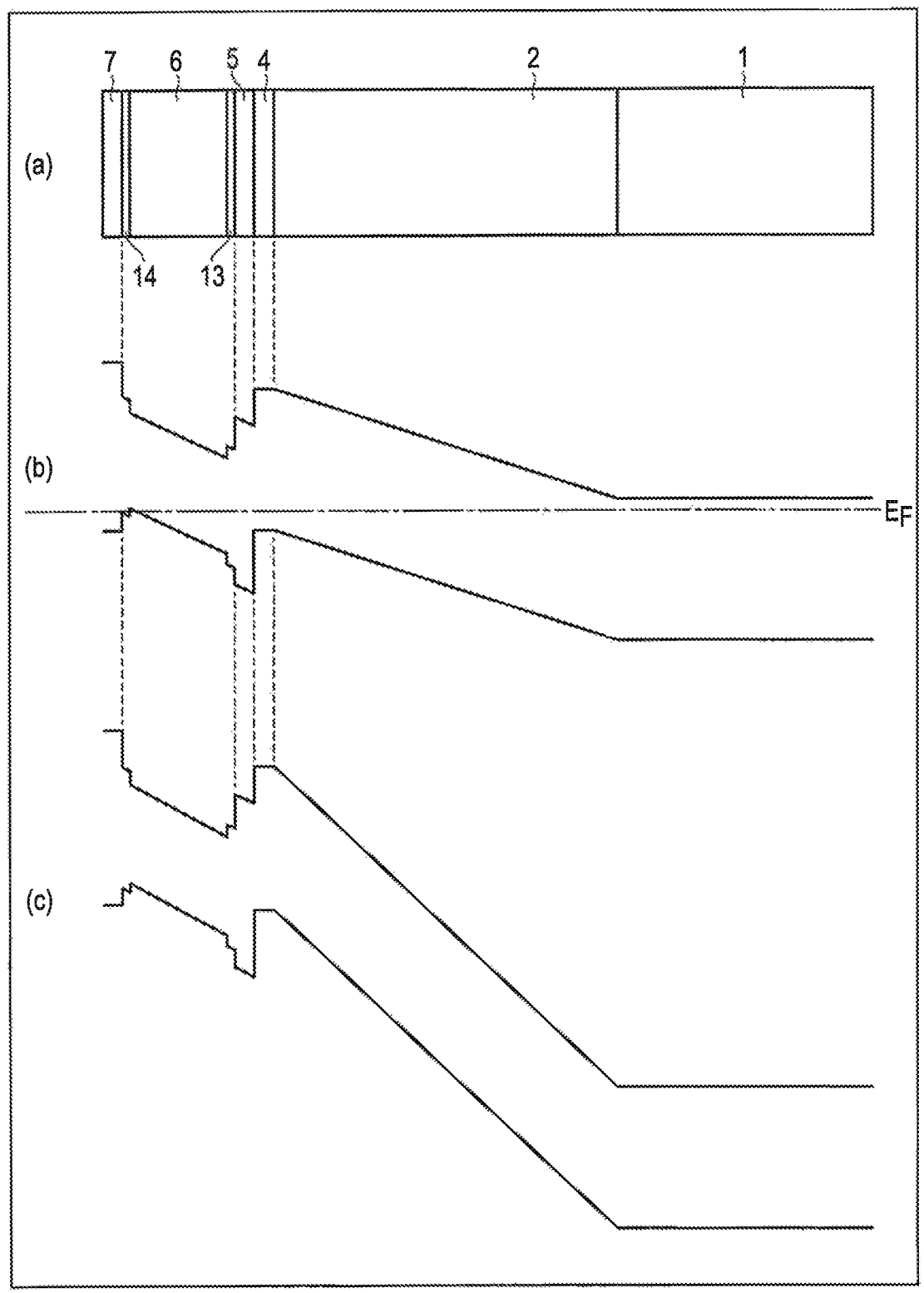
FIG. 3 is a schematic view for describing a layer structure and a band structure of the semiconductor light receiving element according to the first embodiment.

FIG. 3 shows a schematic view of a band structure of the semiconductor light receiving element of the first embodiment, and the same portions as those of FIGS. 1A and 1B are denoted by the same reference numerals.

The (a) of FIG. 3 is a schematic cross-sectional view of the avalanche multiplication part (central portion) of the semiconductor light receiving element of the embodiment of FIGS. 1A and 1B cut away in a vertical direction, and the (b) of FIG. 3 is a thermal equilibrium state band diagram corresponding to each semiconductor layer of the (a) of FIGS. 3, 13 and 14 denote GaInAsP (for example, band gap wavelength=1300 nm: $Ga_{0.28}In_{0.72}As_{0.61}P_{0.39}$, undoped, and thickness=0.01 µm) also shown in FIG. 2D, and there is an effect of alleviating carrier stay in a hetero-interface when carriers generated by light absorption of the GaInAs 6 each move beyond the hetero-interface.

Alternative long and short dash lines of the (b) of FIG. 3 show Fermi levels, and band states of the respective layers are determined by high concentration doping layers such as the n-Si 1, the p-Si 4, and the p-InP 7. The n-Si is not necessarily depleted in a thermal equilibrium state, but it is described that the n-Si 2 is in a depleted state for convenience. On the other hand, low concentration layers from the InP 5 to the GaInAsP 14 are depleted since an electron affinity difference between the p-Si 4 and the InP 5 (hetero-barrier, 0.4 to 0.5 eV) is applied as a potential difference by a rise of the p-InP 7 to a Fermi level to the low concentration layers. However, in order to deplete the InP 5 to the GaInAsP 14 by this electron affinity difference, it is necessary to reduce a residual carrier concentration to $7\times10^{-14}$ $cm^{-1}$ or less when a thickness of the GaInAs 6 is 1 µm and reduce a residual carrier concentration to $3\times10^{-14}$ $cm^{-1}$ or less when a thickness of the GaInAs 6 is 1.5 µm.

The (c) of FIG. 3 shows a state where a reverse bias is applied using the n-Si 1 as a positive electrode and using the p-InP 7 as a negative electrode. As described above, a bias having an electric field peak is applied to a boundary region between the p-Si 4 and the n-Si 2. In this state, when the GaInAs 6 absorbs light to generate carriers, electrons move toward the p-Si 4, are injected into the n-Si 2, and are avalanche-multiplied.

Second Embodiment

Figure 4:
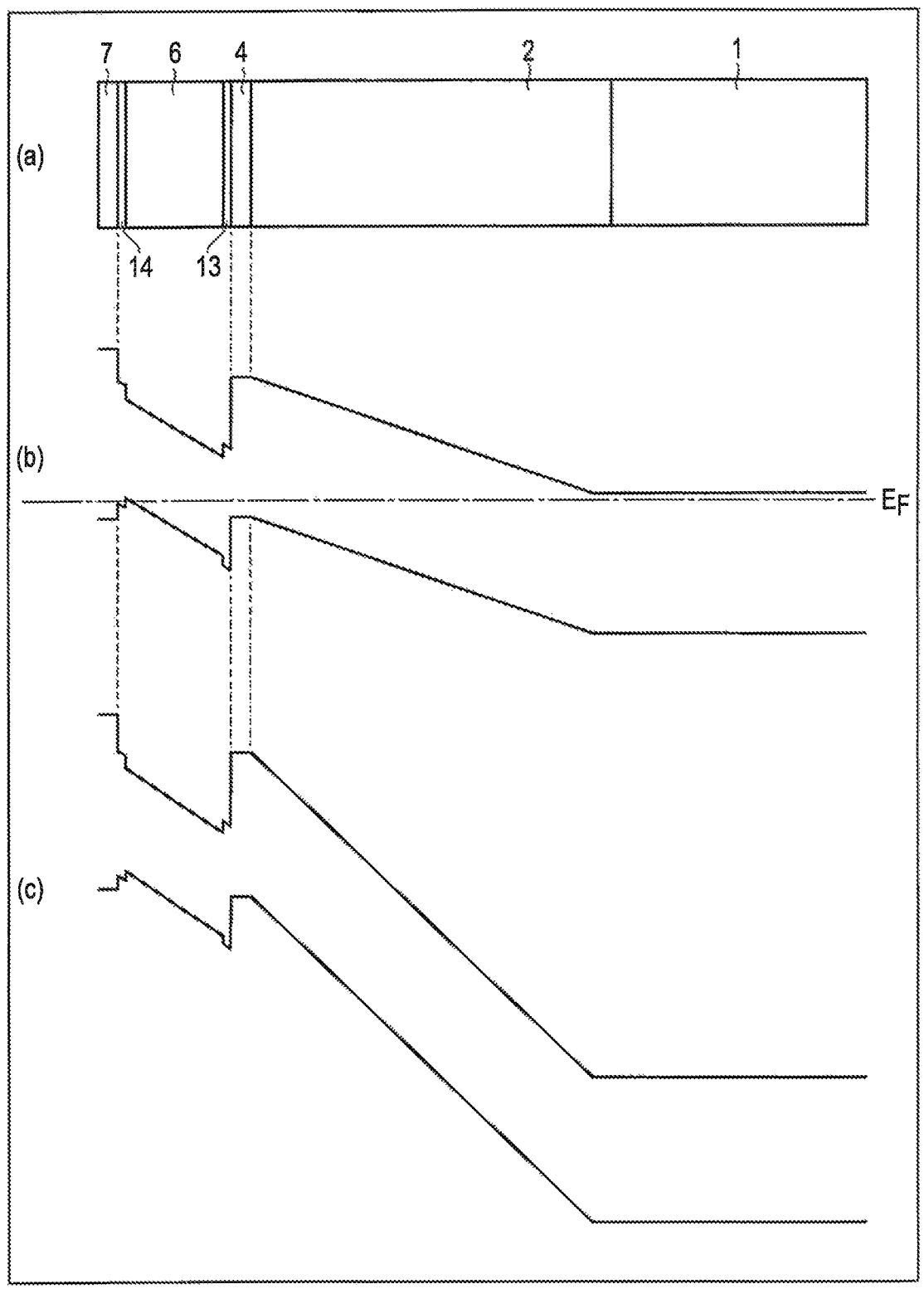
FIG. 4 is a schematic view for describing a layer structure and a band structure of a semiconductor light receiving element according to a second embodiment.

FIG. 4 shows a schematic view of a cross section configuration and a band structure of a semiconductor light receiving element of a second embodiment, and the same portions as those of FIGS. 1A and 1B are denoted by the same reference numerals.

The (a) of FIG. 4 is a schematic cross-sectional view of an avalanche multiplication part (central portion) of the semiconductor light receiving element of the second embodiment cut away in a vertical direction, and the (b) of FIG. 4 is a thermal equilibrium state band diagram corresponding to each semiconductor layer of the (a) of FIG. 4. In the first embodiment, the p-Si 4 and the InP 5 are adhered to each other, but in the second embodiment, a p-Si 4 and a GaInAsP 13 (for example, band gap wavelength=1300 nm: $Ga_{0.28}In_{0.72}As_{0.61}P_{0.39}$, undoped, thickness=0.01 µm) are adhered to each other. In this case, the hetero barrier is reduced to 0.3 to 0.4 eV by a junction of the p-Si 4 and the GaInAsF 13, and a low concentration or a thickness reduction of a GaInAs 6 is required, resulting in a decrease in light receiving efficiency, but it is possible to improve carrier stay when holes generated by avalanche multiplication of an n-Si 2 are emitted from a p-Si 4 to the GaInAs 6. That is, it is possible to shorten a hole annihilation time and increase a response speed as the light receiving element.

Third Embodiment

Figure 5:
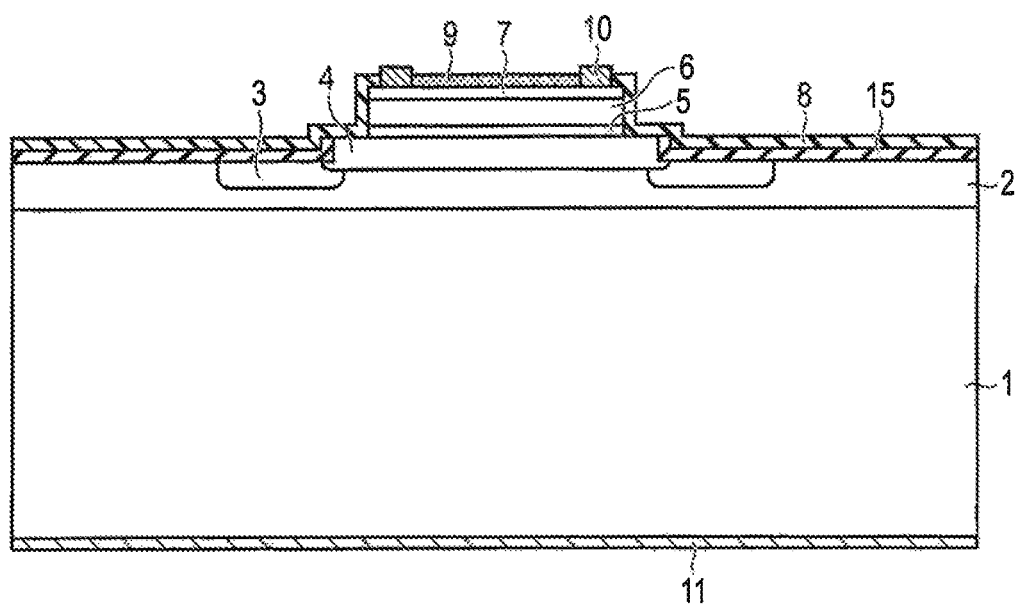
FIG. 5 is a schematic cross-sectional view of a semiconductor light receiving element according to a third embodiment.

FIG. 5 is a schematic configuration diagram of a third embodiment, and the same portions as those of FIGS. 1A and 1B are denoted by the same reference numerals. Here, a passivation film 15 is added to a pn junction between an n-Si 2 and a p-Si 3. For example, the passivation film 15 is formed at 0.3 µm by thermally oxidizing $SiO_2$ at 1100° C. $SiO_2$ becomes the best passivation of Si, but in general, a leakage current due to an interface state, or the like, is generated unless heat treatment is performed on $SiO_2$ at 1000° C. or more. However, a crystal growth temperature itself of a compound semiconductor such as InP or GaAs is 800° C. or less, and the compound semiconductor cannot endure heat treatment at 1000° C. or more. Consequently, a limit of temperature for the simultaneous formation of passivation of Si and compound semiconductor is about 700° C., which is a slightly low temperature for the heat treatment of Si.

Thus, in the embodiment of FIG. 5, the passivation is separately performed for the Si pn junction and the compound semiconductor, for example, the high temperature oxidation $SiO_2$ 15 is used for the Si pn junction, and SiN 8 by plasma CVD and treatment of 500 to 600° C. is used for the compound semiconductor. In this way, it possible to use an optimum passivation material for each semiconductor material, and thus it is possible to obtain a very low dark current and a stable passivation film. In this case, suitable passivation material can be used for each of the semiconductor materials, and thus very low dark current and stable passivation films can be obtained. In this case, the SiN 8 does not need to be formed on the entire surface, but needs to be formed on the compound semiconductor and its surrounding (e.g., a region having 5 µm width from the compound semiconductor).

However, the thermal oxidation $SiO_2$ is obtained by oxidizing a part of Si, so that the surface does not become flat in general when the thermal oxidation $SiO_2$ is selectively formed. That is, when the p-Si 3 and the p-Si 4 are formed, and the $SiO_2$ passivation is formed by for example 0.3 µm on the pn junction with the n-Si 2, and then the thermal oxidation is performed after forming the SiN for protecting the p-Si 4 surface, the Si surface is lowered by about 0.15 µm as Si is supplied to $SiO_2$, by contrast the formed $SiO_2$ film surface is heightened by about 0.15 µm. Consequently, the originally flat Si surface is changed to have a concave portion on a region where the protection film is formed, and a convex portion on a region where the $SiO_2$ thermal oxidation film is formed. For this reason, there occurs a problem that the p-Si 4 and the compound semiconductor can not be adhered to each other in the process of adhering the compound semiconductor chips shown in FIG. 2D.

In addition, similar to the thermal oxidation, the good passivation is also performed by forming $SiO_2$ by CVD, and performing anneal process at a temperature, for example 1100° C., however the $SiO_2$ film on the p-Si 4 need to be finally etched and removed to form an opening. As a result, a surface is not flat as in the selective thermal oxidation.

For this reason, in the embodiment of FIG. 5, a surface of Si other than the p-Si 4 is etched in advance and formed to be low, such that a surface of the thermally oxidized $SiO_2$ 15 is configured to become lower than that of the p-Si 4. In addition, likewise, the surface of Si other than the p-Si 4 is etched and formed to be low in advance, then a $SiO_2$ is formed by CVD with a thickness that restrict the $SiO_2$ to protrude from the surface of the p-Si 4, then the $SiO_2$ is subjected to a heat treatment at 800° C. or more, and then the $SiO_2$ on a surface portion of the p-Si 4 is etched and opened.

In this way, it possible to avoid an adhesion defect of the compound semiconductor chips due to protrusion of $SiO_2$ while securing flatness of surfaces on which the compound semiconductor chips are adhered. In addition, a protective film may be formed on an outer circumference of a chip of the n-Si 2 (a region outside the p-Si 3) simultaneously with the surface of the p-Si 4, and may have the same height as that of the p-Si 4. In this case, the process of adhering the compound semiconductor chip can be stabilized since the chip periphery functions as an outer peripheral supporting surface at the time of adhering the compound semiconductor chip.

FIGS. 6A to 6F are schematic cross-sectional views showing manufacturing processes of the semiconductor light receiving element of to the third embodiment, and the same portions as those of FIG. 5 are denoted by the same reference numerals.

Figure 6A:
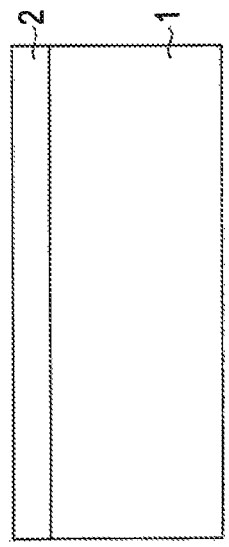
FIGS. 6A, 6B, 6C, 6D, 6E and 6F are schematic cross-sectional views of manufacturing processes of the semiconductor light receiving element according to the third embodiment.

FIG. 6A shows a formation of the n-Si 2 onto the n-Si substrate 1, for example, n-type Si crystal is epitaxially grown by chemical vapor deposition (CVD) process in which $SiHCl_3$ is used as a source, and P, As, or Sb is used as a dopant.

Figure 6B:
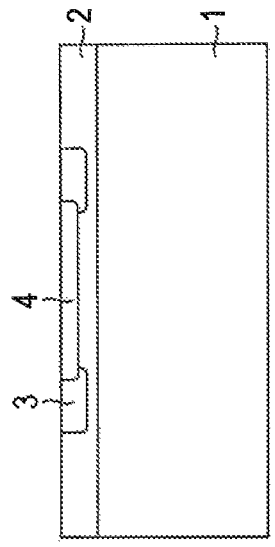

FIG. 6B shows a formation of the guard ring p-Si 3 and the high concentration p-Si 4. The guard ring p-Si 3 is formed by, for example, B ion implantation and thermal annealing, and the ion implantation includes implanting ions from a shallow region to a deep region by multi-implantation to form a uniform dopant profile. The high concentration p-Si 4 is formed to have a sharp concentration gradient by, for example, a shallow high concentrations B ion implantation and a rapid thermal annealing (RTA).

Figure 6C:
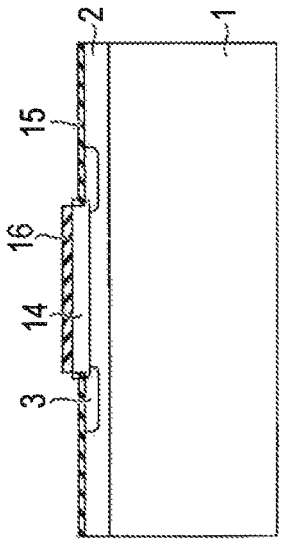

FIG. 6C shows a formation of the $SiO_2$ passivation film 15, for example, a SiN protection film 16 of 0.3 µm thickness is formed on the upper portion of the p-Si 4, and exposed Si surface is etched by 0.2 µm using reactive ion etching (RIE). Then, thermal oxidation is performed at 800° C. or more, for example, 1100° C. to form the $SiO_2$ film 15 at a thickness of 0.3 µm. At this time, if the depth of etching for the above mentioned exposed Si surface is a half or more of the film thickness of the $SiO_2$ film 15, the $SiO_2$ film 15 does not protrude from the surface of the p-Si 4. The SiN protective film 16 is selectively removed by, for example, hot phosphoric acid etching.

Figure 6D:
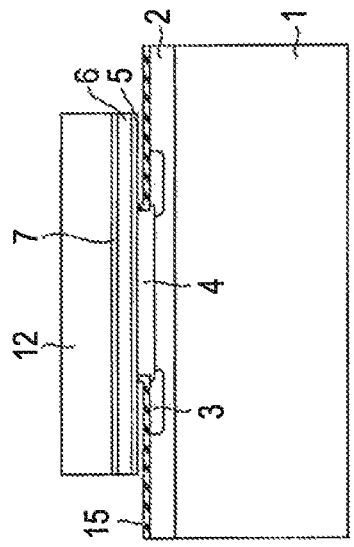

FIG. 6D shows an adhering of the compound semiconductor chips obtained by dividing the epitaxially grown compound semiconductor wafer. An InP 5 is brought into contact with the p-Si 4 in a clean state, and heat treatment is performed while pressurizing the InP 5 to adhere InP and Si to each other. In the stage of FIG. 6D, the compound semiconductor chip may be somewhat larger than the region of the P—Si 4 (e.g., sum of the area of the p-Si 4 and the area of an alignment margin). In addition, the compound semiconductor chips may be adhered by a method disclosed in JP 2016-92078 A, or the like. A large diameter wafer (for example, 8 inch Φ, 12 inch Φ, or the like) can be used as a Si wafer, so that a size of the wafer can be set independently of a size of a epitaxially grown compound semiconductor wafer. The adhering of compound semiconductor chips may be performed in a unit of a light receiving region size of a semiconductor light receiving element, or a size covering an array region in the case of a semiconductor light receiving element array or the like, and sizes of the Si wafer and the epitaxially grown compound semiconductor wafer can be set completely independently of each other by adhering compound semiconductor chips obtained from several epitaxially grown compound semiconductor wafers to one Si wafer.

In this way, a pseudo large diameter compound semiconductor wafer can be configured by using an epitaxially grown compound semiconductor wafer having a small diameter, and a manufacturing process cost per device can be reduced by performing the subsequent processes in a unit of a large diameter Si wafer.

Figure 6E:
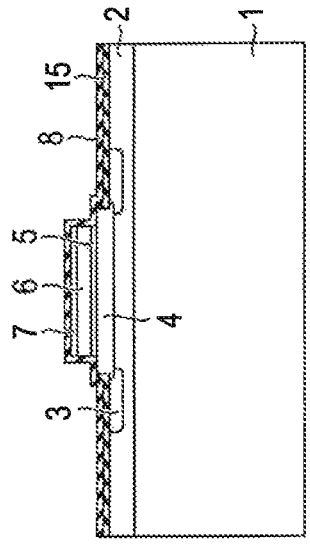

FIG. 6E shows a trimming of the compound semiconductor layer and a formation of the passivation film 8. An InP substrate 12 is removed by mechanical grinding and etching, and the compound semiconductor is etched and removed in a state where the light receiving region remains by photolithography. Even though the compound semiconductor chips are slightly misaligned in the step of FIG. 6D, the final light receiving region can be defined by a mask pattern of the photolithography in this step. The passivation film 8 is obtained by, for example, forming a SiN film by plasma CVD, and then performing a heat treatment at, for example 600° C. The passivation film 8 needs not to be formed over the entire surface, and may be provided only on the compound semiconductor layer and its surrounding (e.g., a region having 5 µm width from the compound semiconductor). SiN of the passivation film 8 can also serve as an AR film 9 to be described below.

Figure 6F:
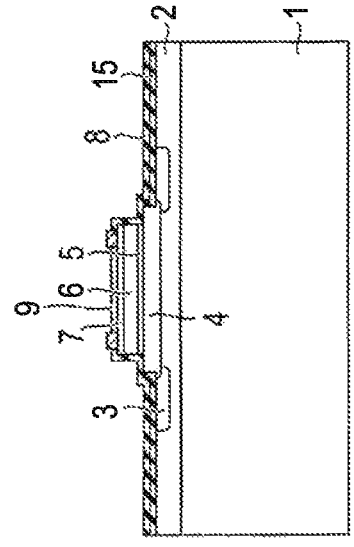

FIG. 6F shows a formation of the AR film 9 by photolithography and CVD, and formations of the electrodes 10 and 11. An electrode metal can be formed by, for example, sputtering, electron beam evaporation, or the like.

In this way, the light receiving element of the embodiment can use the $SiO_2$ film subjected to the thermal oxidation or the high temperature treatment as the passivation film for the Si pn junction, and thus improvement of the element is achieved.

Fourth Embodiment

Figure 7:
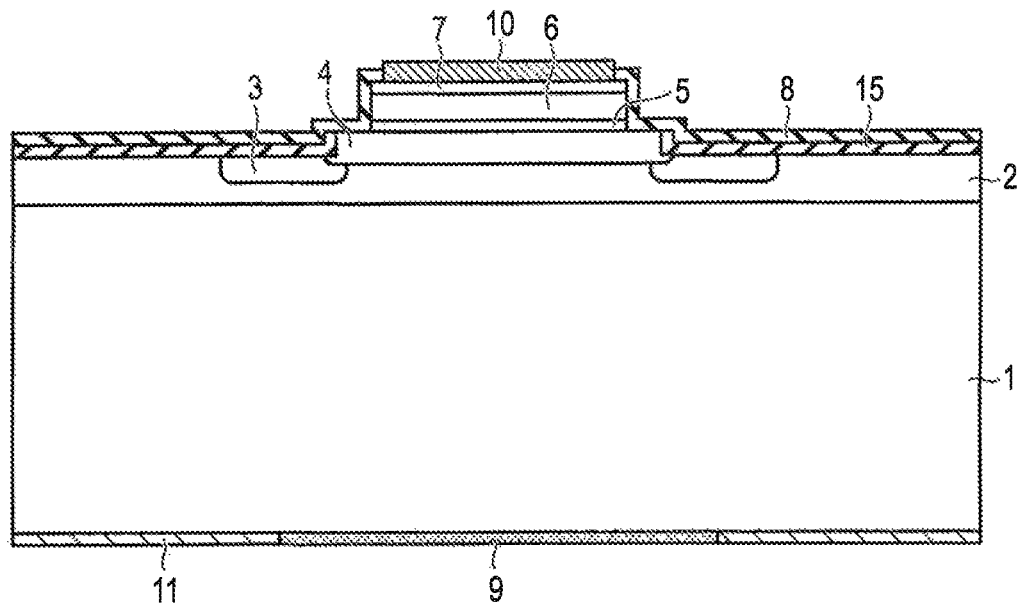
FIG. 7 is a schematic cross-sectional view of a semiconductor light receiving element according to a fourth embodiment.

FIG. 7 is a schematic configuration diagram according to a fourth embodiment, and the same portions as those of FIGS. 6A to 6F are denoted by the same reference numerals. Here, an AR film 9 is provided on an n-Si substrate 1, and an electrode 10 is formed so as to cover most of the p-InP 7. In the fourth embodiment, light is not incident from the top side of a compound semiconductor layer, but is incident from a rear side of a Si substrate.

In the case of a Si light receiving device, when a light incident surface is changed into a Si substrate side, light is mainly absorbed in a surface layer of the rear surface of the Si substrate, and the Si light receiving device does not function as a light receiving device unless the entire Si substrate is depleted. Therefore, in the Si light receiving device, a device structure needs to be completely changed for the purpose of back surface light incidence.

In the semiconductor light receiving element of the present embodiment, the compound semiconductor layer is used as a light absorbing portion, and it is thus possible to change the device structure into a back surface light incidence structure without significantly changing a structure other than a light incident portion, with respect to a wavelength (for example, 1200 to 1700 nm) longer than an absorption wavelength of Si.

In the back surface incidence type semiconductor light receiving element of the present embodiment, the Si substrate side of a GaInAs 6 mainly absorbs light, a peak of an electron concentration by light absorption becomes close to a p-Si 4, and electrons injection efficiency to a Si avalanche multiplication part is increased. In addition, incident light that could not be absorbed by the GaInAs 6 can be reflected by the electrode 10, and can again pass through the GaInAs 6 and be absorbed. For that reason, in the light receiving efficiency of the semiconductor light receiving element of the embodiment, by employing Al, Ag or Ni or the like as the lowermost layer of the electrode 10, the light receiving efficiency can be improved by about 1.6 times even the thickness of the GaInAs 6 is same as that of the surface incident type element of FIG. 5. In addition, when the light receiving efficiency is same as the surface incident type element, the residual carrier concentration margin of the element of the embodiment can be improved by thinning the thickness of the GaInAs 6, and the yield of epitaxial crystal growth is improved, thereby enabling the cost reduction. In addition, It is needless to say that a crystal growth cost itself can be reduced as much as the thickness of the GaInAs 6 is reduced.

Fifth Embodiment

Figure 8:
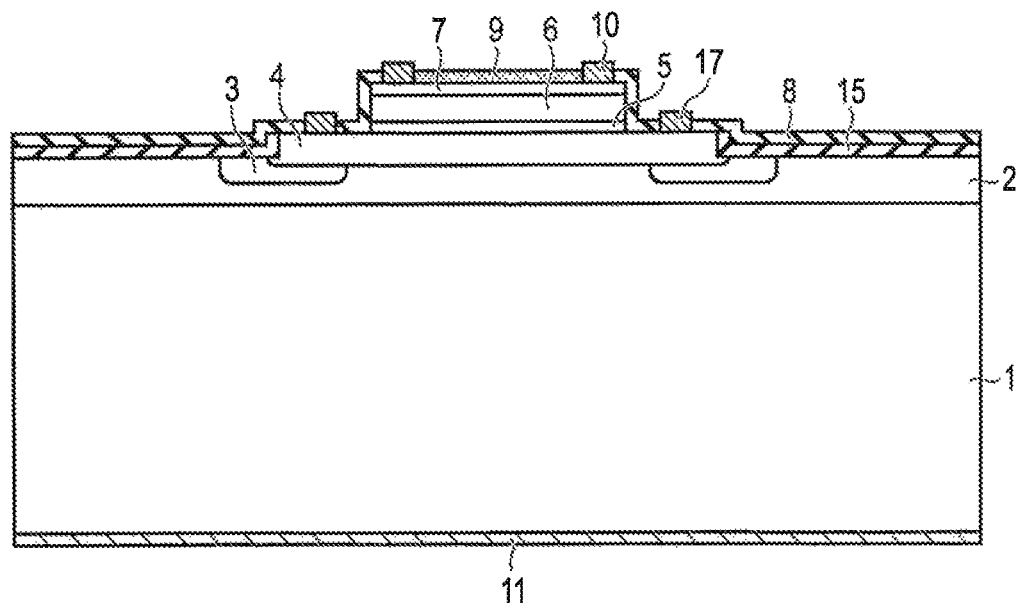
FIG. 8 is a schematic cross-sectional view of a semiconductor light receiving element according to a fifth embodiment.

FIG. 8 is a schematic configuration diagram according to a fifth embodiment, and the same portions as those of FIGS. 6A to 6F are denoted by the same reference numerals. Here, a third electrode 17 (for example, Al) is provided in a region of p-Si. In the first to fourth embodiments, a voltage is collectively applied to an electrode 10 and an electrode 11, whereas in the fifth embodiment, the compound semiconductor light absorption layer and the Si avalanche multiplication part can be independently applied with bias voltages. In this way, it is possible to independently set the light receiving layer and the avalanche multiplication part at optimal biases, respectively, to pulse-drive the avalanche multiplication part, or to extract a hole current by avalanche multiplication from the electrode 17 to implement driving such as high speed response.

Sixth Embodiment

Figure 9:
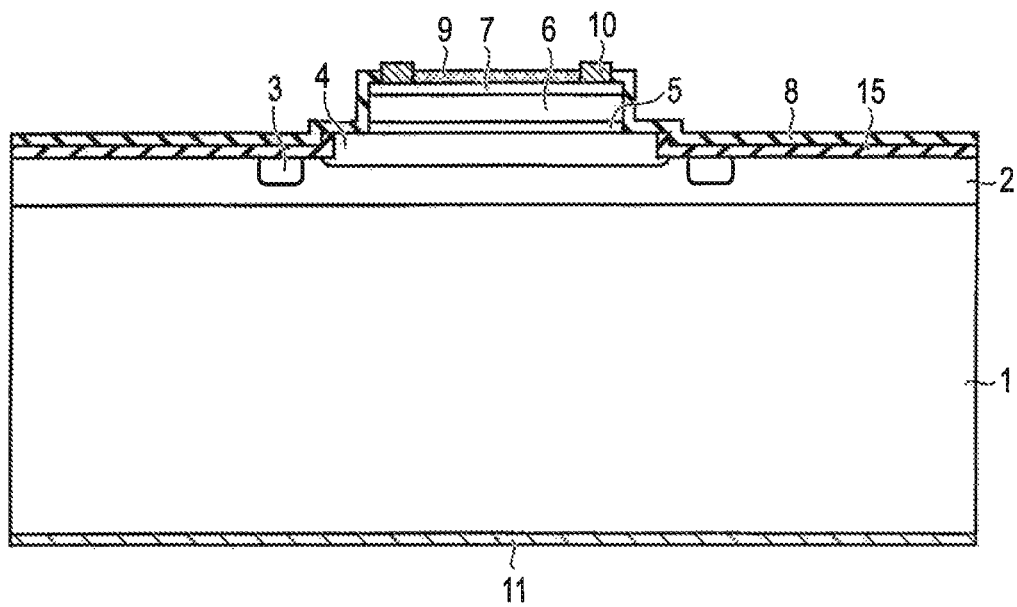
FIG. 9 is a schematic cross-sectional view of a semiconductor light receiving element according to a sixth embodiment.

FIG. 9 is a schematic configuration diagram according to a sixth embodiment, and the same portions as those of FIG. 5 are denoted by the same reference numerals.

The present embodiment is different from the first and third embodiment in that a p-Si 3 (guard ring) is provided to be spaced apart from a p-Si 4 (avalanche multiplication region). Since the p-Si 3 is not in contact with the p-Si 4, a voltage of the p-Si 4 is not directly applied to the p-Si 3, and it is easy to increase a breakdown voltage by a voltage amount until a depletion layer extending from the p-Si 4 reaches the p-Si 3. Conversely, the guard ring curvature can be reduced by amount of the improvement of the breakdown voltage, and thus a region width of the guard ring (p-Si 3) can be narrowed. However, in this case, a condition is required that a local breakdown does not occurred around the p-Si 4 due to the voltage resulting from the depletion layer extending from the p-Si 4 and reaching the p-Si 3. Thereby, reducing occupied areas of the guard ring to enlarge the light receiving region, that is, the effective aperture ratio is improved.

Seventh Embodiment

Figure 10:
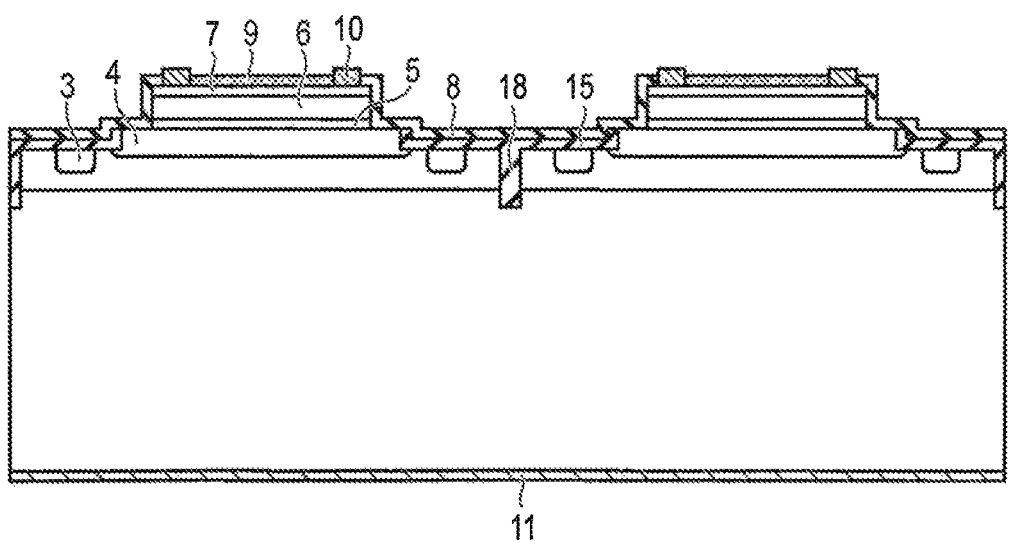
FIG. 10 is a schematic cross-sectional view of a semiconductor light receiving element according to a seventh embodiment.
Figure 11:
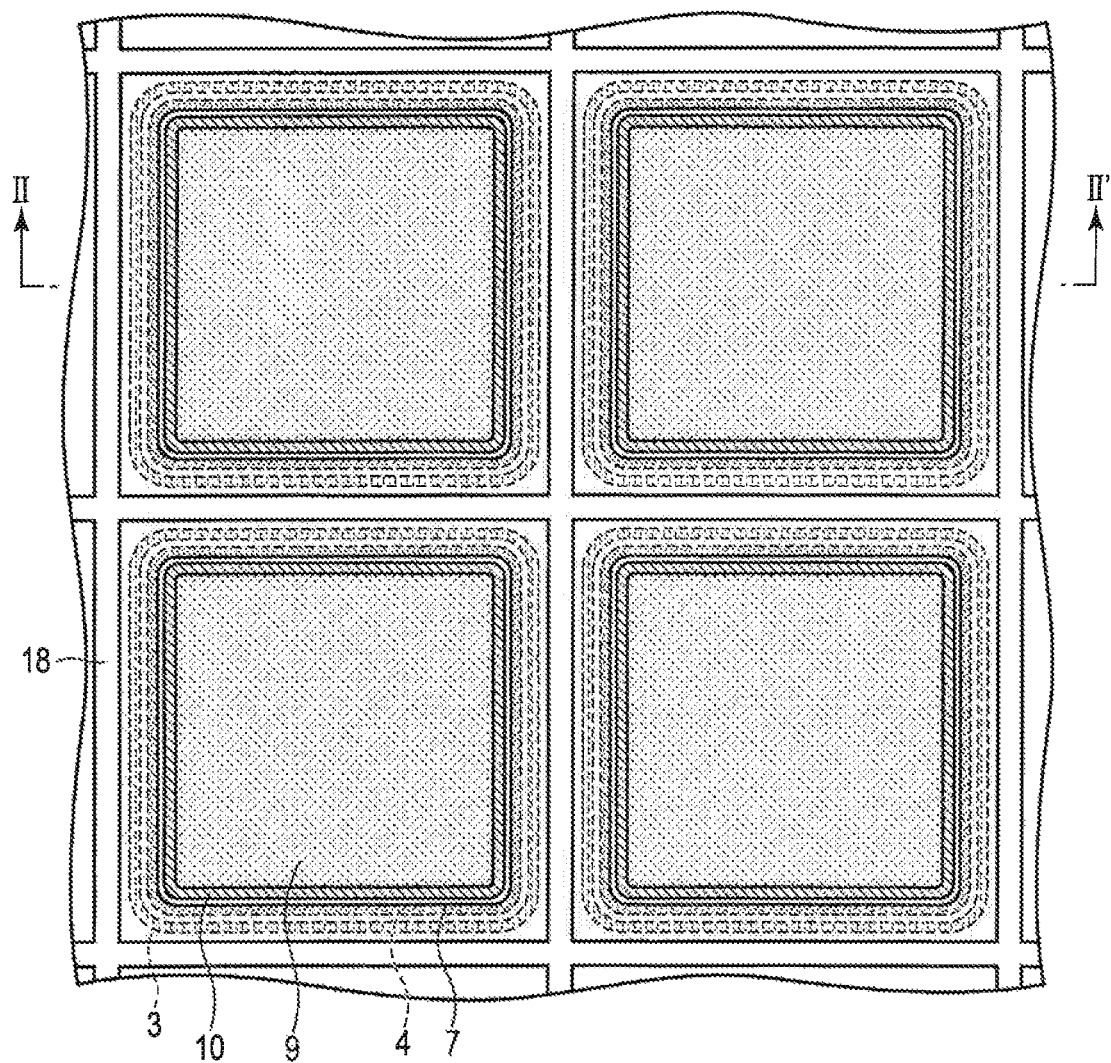
FIG. 11 is a schematic plan view of the semiconductor light receiving element according to the seventh embodiment.

FIGS. 10 and 11 are for describing a schematic configuration according to a seventh embodiment, FIG. 10 is a schematic cross-sectional view and FIG. 11 is a schematic plan view for describing a schematic structure, and the same portions as those of FIG. 9 are denoted by the same reference numerals. In addition, FIG. 10 corresponds to a cross section taken along line II-II' of FIG. 11, but the scale of the drawing has been appropriately changed for convenience of explanation. In addition, FIGS. 12A to 12F are schematic cross-sectional views showing manufacturing processes of the semiconductor light receiving element according to the seventh embodiment.

The present embodiment is an example in which a plurality of semiconductor light receiving elements are arranged in an array form, and an n-Si epitaxial layer 2 is provided on an n-Si substrate 1, and p-Si 3 (guard rings) and p-Si 4 (avalanche multiplication regions) are arranged in a matrix form. In addition, compound semiconductor epitaxial layers including an InP 5, a GaInAs 6, and a p-InP 7 are provided on the avalanche multiplication regions, respectively. It is noted that only four array elements are shown in FIG. 11, but the numbers of the array elements may be more than four.

Adjacent light receiving elements are isolated by trench isolation ($SiO_2$) 18. This trench isolation 18 is formed before a formation of the guard rings and the avalanche multiplication parts in advance. More specifically, the n-Si 2 is epitaxially grown on the n-Si substrate 1 (FIG. 12A), an nitride film (not shown) is formed on a region except for a trench portion for the isolation, the trench is formed by RIE or the like by using the nitride film as a mask, a silicon oxide film is formed in a manner to fill this trench, then an unnecessary part of the silicon oxide film is removed by chemical mechanical polishing (CMP), and then the nitride film used as the mask is removed, thereby obtaining the trench isolation 18 (FIG. 12B).

Subsequently, the p-Si (guard ring), the p-Si 4 (avalanche multiplication part) is formed, for example, the silicon protection film of 0.3 µm thickness is formed on the upper portion of the p-Si 4, the exposed surface of the Si is etched by 0.2 µm using RIE. At this time, although the trench isolation 18 slightly protrudes, the protruded portion may be unprocessed, or etched by wet etching or the like. Following that, for example, thermal oxide at 1100° C. is performed to form the $SiO_2$ film 15 by 0.3 µm (FIG. 12C). After that, the SiN protection film 16 is selectively removed by, for example, hot phosphoric acid etching. Thereafter, the compound semiconductor chip (the InP substrate 12 with the compound semiconductor layers 5, 6, and 7) is adhered (FIG. 12D), and after the InP substrates 12 are removed, patterning of the compound semiconductor layers is performed (FIG. 12E). After that, a SiN passivation film 8 is formed (FIG. 12F), and electrodes and an AR film are formed to complete the semiconductor light receiving element.

The p-Si 4 and the compound semiconductor epitaxial layers 5, 6, and 7 have a shape similar to a rectangular shape, but corners of thereof have a curvature enough not to cause local breakdown. In this way, a light receiving portion aperture ratio can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light receiving element comprising:
   a Si substrate;
   a Si avalanche multiplication part provided on the Si substrate;

a Si pn junction surrounding the Si avalanche multiplication part, and comprising a junction end part at a height different from that of the Si avalanche multiplication part;
a passivation film provided on the junction end part of the Si pn junction; and
a compound semiconductor light receiving layer selectively provided inside a region on the Si pn junction and inside a region on a p-type Si.

2. The semiconductor light receiving element of claim 1, wherein a distance between a circumferential portion of the Si pn junction and a circumferential portion of the compound semiconductor light receiving layer is equal to or larger than a carrier diffusion length.

3. The semiconductor light receiving element of claim 1, wherein a distance between a circumferential portion of the Si avalanche multiplication part and a circumferential portion of the compound semiconductor light receiving layer is equal to or larger than a carrier diffusion length.

4. The semiconductor light receiving element of claim 1, wherein the junction end part of the Si pn junction is provided on a surface more adjacent to the Si substrate as compared with a lowest surface of a compound semiconductor layer.

5. The semiconductor light receiving element of claim 1, wherein the passivation film includes a silicon oxide in contact with the junction end part of the Si pn junction.

6. The semiconductor light receiving element of claim 5, comprising a passivation film includes a silicon nitride in contact with an end part of the compound semiconductor light receiving layer.

7. The semiconductor light receiving element of claim 1, comprising an electrode provided on a p-type Si region.

8. The semiconductor light receiving element of claim 1, comprising a light receiving window provided on the Si substrate.

9. A semiconductor light receiving element comprising:
a Si substrate;
a Si avalanche multiplication part provide on the Si substrate;
a Si pn junction surrounding the Si avalanche multiplication part;
a compound semiconductor light receiving layer selectively provided inside a region on the Si pn junction;
a passivation film covering a junction end part of the Si pn junction; and
wherein a distance of the junction end part from a first plane including a boundary between the Si substrate and the lowest surface of the compound semiconductor layer in a thickness direction of the Si substrate is different from a distance of the Si avalanche multiplication part from the first plane in the thickness direction of the Si substrate.

10. The semiconductor light receiving element of claim 9, wherein a distance between a circumferential portion of the Si pn junction and a circumferential portion of the compound semiconductor light receiving layer is equal to or larger than a carrier diffusion length.

11. The semiconductor light receiving element of claim 9, wherein a distance between a circumferential portion of the Si avalanche multiplication part and a circumferential portion of the compound semiconductor light receiving layer is equal to or larger than a carrier diffusion length.

12. The semiconductor light receiving element of claim 9, wherein the compound semiconductor light receiving layer is selectively provided inside a region on a p-type Si.

13. The semiconductor light receiving element of claim 9, wherein the junction end part of the Si pn junction is provided on a surface more adjacent to the Si substrate as compared with a lowest surface of a compound semiconductor layer.

14. The semiconductor light receiving element of claim 9, wherein the passivation film includes a silicon oxide in contact with the junction end part of the Si pn junction.

15. The semiconductor light receiving element of claim 14, comprising a passivation film includes a silicon nitride in contact with the end part of the compound semiconductor light receiving layer.

16. The semiconductor light receiving element of claim 9, comprising an electrode provided on a p-type Si region.

17. The semiconductor light receiving element of claim 9, comprising a light receiving window provided on the Si substrate.

* * * * *